(12) United States Patent
San Antonio et al.

(10) Patent No.: US 7,816,186 B2
(45) Date of Patent: Oct. 19, 2010

(54) METHOD FOR MAKING QFN PACKAGE WITH POWER AND GROUND RINGS

(75) Inventors: Romarico S. San Antonio, Batam Island (ID); Anang Subagio, Batam Island (ID)

(73) Assignee: Unisem (Mauritius) Holdings Limited, Port Louis (MU)

( * ) Notice: Subject to any disclaimer, the term of this patent is extended or adjusted under 35 U.S.C. 154(b) by 325 days.

(21) Appl. No.: 11/714,390

(22) Filed: Mar. 6, 2007

(65) Prior Publication Data

US 2007/0215990 A1 Sep. 20, 2007

Related U.S. Application Data

(60) Provisional application No. 60/782,255, filed on Mar. 14, 2006.

(51) Int. Cl.
*H01L 21/44* (2006.01)

(52) U.S. Cl. .................. 438/123; 438/121; 257/666; 257/670; 257/676; 257/E23.037; 257/E23.046

(58) Field of Classification Search ............... 438/121, 438/123; 257/666, 670, 676, E23.037, E23.046
See application file for complete search history.

(56) References Cited

U.S. PATENT DOCUMENTS

| | | | |
|---|---|---|---|
| 5,764,484 A | 6/1998 | Hoffman et al. | 361/761 |
| 5,877,551 A | 3/1999 | Tostado et al. | 257/701 |
| 6,081,029 A * | 6/2000 | Yamaguchi | 257/718 |
| 6,348,726 B1 * | 2/2002 | Bayan et al. | 257/666 |
| 6,630,373 B2 * | 10/2003 | Punzalan et al. | 438/123 |
| 6,713,322 B2 * | 3/2004 | Lee | 438/123 |
| 6,812,552 B2 | 11/2004 | Islam et al. | 257/666 |
| 6,812,580 B1 | 11/2004 | Wenzel et al. | 257/784 |
| 2001/0008305 A1 * | 7/2001 | McLellan et al. | 257/692 |
| 2002/0024122 A1 * | 2/2002 | Jung et al. | 257/666 |
| 2002/0140061 A1 * | 10/2002 | Lee | 257/666 |
| 2004/0070056 A1 * | 4/2004 | Matsuzawa et al. | 257/666 |
| 2004/0097017 A1 | 5/2004 | Shimanuki | |
| 2004/0238921 A1 * | 12/2004 | Lee et al. | 257/666 |
| 2005/0006735 A1 * | 1/2005 | an Tatt et al. | 257/676 |
| 2005/0051877 A1 * | 3/2005 | Hsu | 257/667 |

FOREIGN PATENT DOCUMENTS

WO 2005/017968 2/2005

* cited by examiner

*Primary Examiner*—Andy Huynh
(74) *Attorney, Agent, or Firm*—Wiggin and Dana LLP

(57) ABSTRACT

A method to manufacture a package that encases at least one integrated circuit device and the package so manufactured. The method includes the steps of (1) providing a leadframe having a die pad, leads, at least one ring circumscribing the die pad and disposed between the die pad and the leads, a plurality of tie bars projecting outwardly from the at least one ring, and at least one connecting bar electrically interconnecting and mechanically supporting the die pad to the ring; (2) affixing the at least one integrated circuit device to a first side of the die pad and electrically interconnecting the at least one integrated circuit device to the leads and to the at least one ring; (3) encapsulating the at least one integrated circuit device, the first side of the die pad and a first side of the ring in a molding resin while retaining an opposing second side of the ring external to said molding resin; and (4) severing the at least one connecting bar to electrically isolate the die pad from the ring.

20 Claims, 3 Drawing Sheets

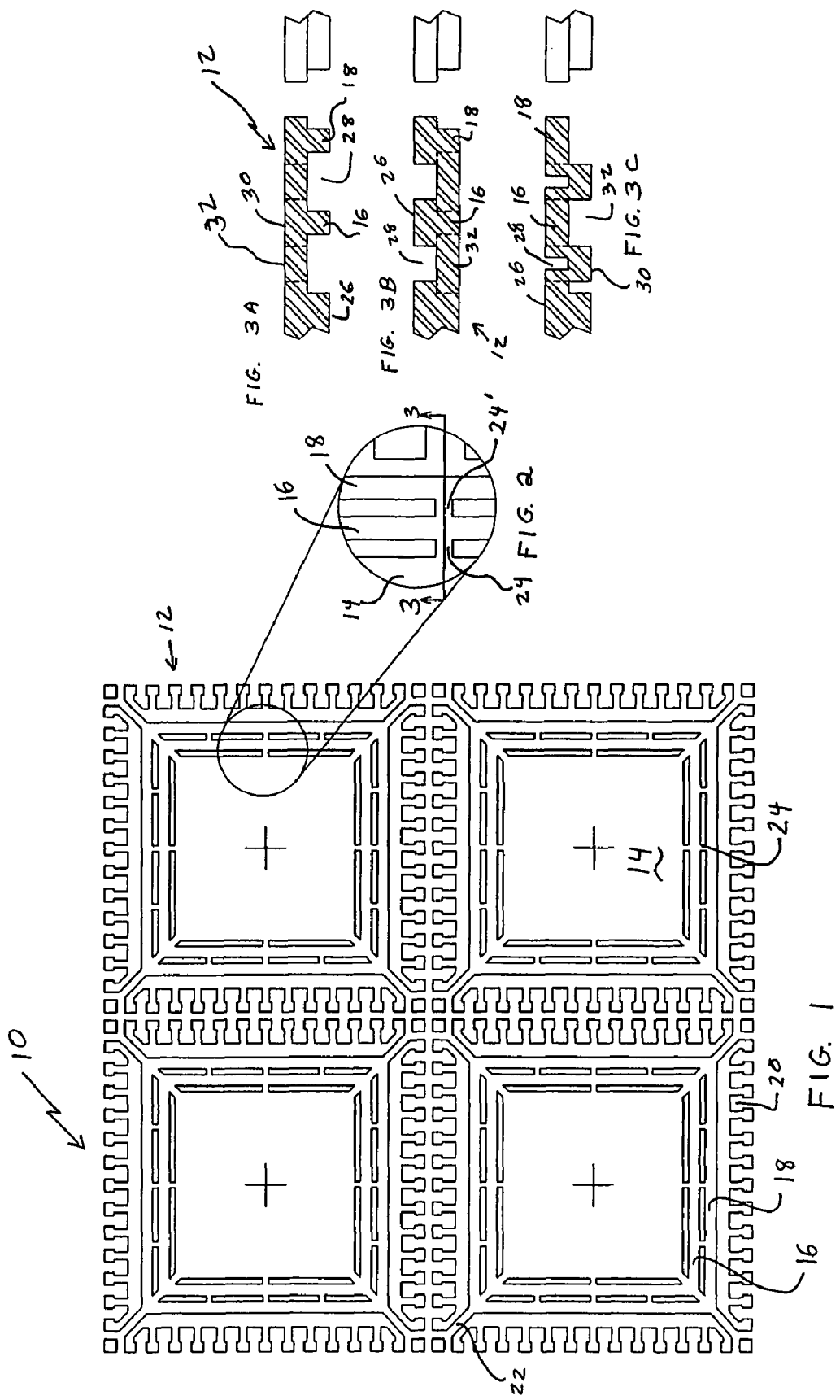

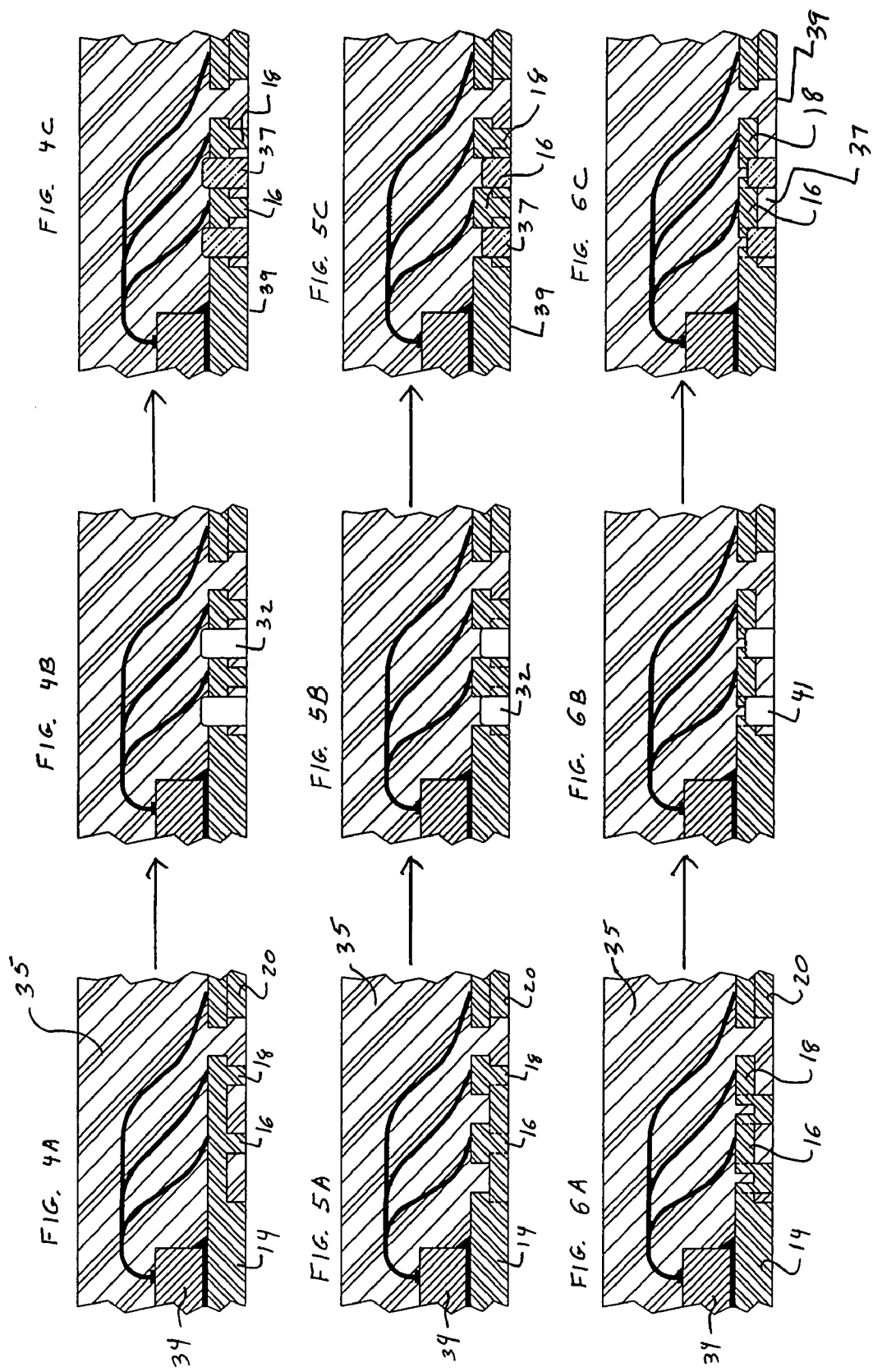

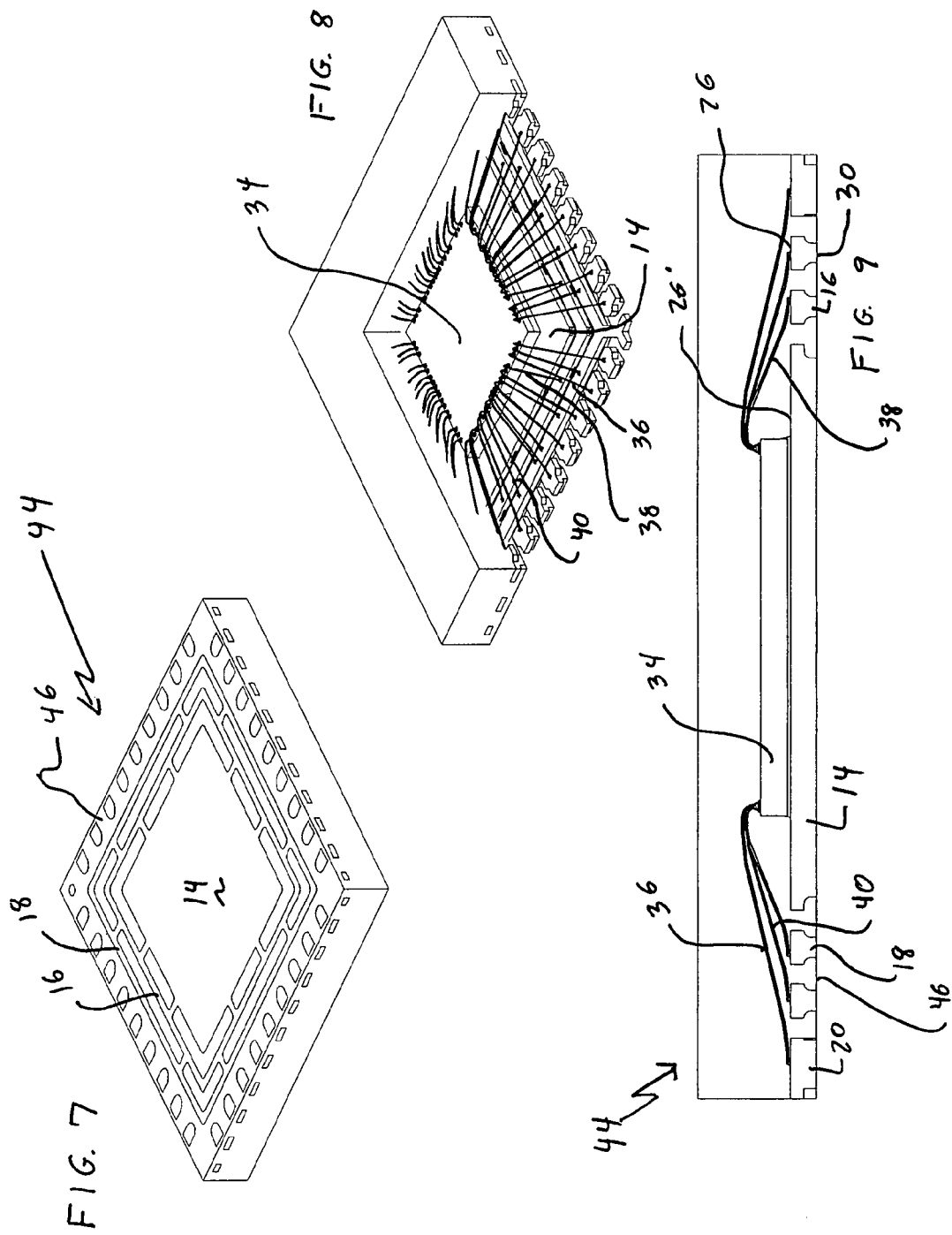

METHOD FOR MAKING QFN PACKAGE WITH POWER AND GROUND RINGS

CROSS REFERENCE TO RELATED APPLICATION(S)

This patent application claims priority to U.S. Provisional Patent Application Ser. No. 60/782,255 that is titled, "Method of Making QFN Package with Power and Ground Rings" and was filed on Mar. 14, 2006. The subject matter of Provisional Patent Application Ser. No. 60/782,255 is incorporated by reference herein in its entirety.

U.S. GOVERNMENT RIGHTS

N.A.

BACKGROUND OF THE INVENTION

1. Field of the Invention

This invention relates to packages to encapsulate one or more integrated circuit devices, and more particularly to a method for the manufacture of a no external lead package having a die pad and at least one of a power ring or ground ring circumscribing the die pad.

2. Description of the Related Art

In lead frame based semiconductor packages, electrical signals are transmitted between at least one integrated circuit device (die) and external circuitry, such as a printed circuit board, by an electrically conductive lead frame. The lead frame includes a number of leads, each having an inner lead end and an opposing outer lead frame end. The inner lead ends are electrically interconnected to input/output (I/O) pads on the die and the outer lead ends provide terminals outside the package body for interconnection to external circuitry. When the outer lead end terminates at a sidewall of the package body, the package is known as a "no lead" package. If the outer leads extend beyond the package body perimeter, the package is referred to as "leaded." Examples of well known no-lead packages include quad flat no lead (QFN) packages which have four sets of leads disposed around the perimeter of the bottom of a square package body and dual flat no lead (DFN) packages which have two sets of lead disposed along opposite sides of the bottom of a package body.

Interconnection of the die to the inner lead ends is typically performed using wire bonding, tape automated bonding (TAB) or flip chip bonding. In wire bonding or TAB bonding, the inner lead ends terminate a distance from the die and are electrically interconnected to I/O pads on an electrically active face of the die by small diameter wires or conductive tape. The die may be supported by a die pad which is surrounded by the leads. In flip chip bonding, the inner lead ends of the lead frame extend beneath the die and the die is flipped so that the I/O pads on the electrically active face of the die contact the inner lead ends by a direct electrical contact, such as a solder joint.

A representative QFN package and its method of manufacture is more fully disclosed in commonly owned U.S. patent application Ser. No. 10/563,712 published as PCT International Application No. WO2005/017968 A2 on Feb. 24, 2005. The disclosure of U.S. patent application Ser. No. 10/563,712 is incorporated by reference in its entirety herein.

In certain package configurations, multiple I/O pads and the circuitry on the electrically active face of the integrated circuit device associated with those I/O pads are to be at a common voltage or interconnected to a common ground. Rather than interconnecting these I/O pads to multiple leads, it is known in a dielectric substrate type package to form one or more conductive rings around the die pad and utilize these rings as common voltage buses or common ground. FIG. 1 of U.S. Pat. No. 6,812,580 to Wenzel et al. discloses two ring-shaped power buses. However, it has not been known to form such power buses in a lead-frame based package, such as a QFN. For example, FIG. 6 of U.S. Pat. No. 6,812,580 shows the die pad as a ground and a lead as a signal source. U.S. Pat. No. 6,812,580 is incorporated by reference in its entirety herein.

Lead frame based packages have better thermal performance, that is they conduct heat away from the integrated circuit device more efficiently, than substrate based packages. A lead frame based package having at least one power and/or ground bus circumscribing a die pad would have improved thermal and electrical properties over presently available no-lead packages. There remains, a need for such a package in the art.

BRIEF SUMMARY OF THE INVENTION

The details of one or more embodiments of the invention are set forth in the accompanying drawings and the description below. Other features, objects and advantages of the invention will be apparent from the description and drawings, and from the claims.

In accordance with an embodiment of the invention, there is provided a method to manufacture a package that encases at least one integrated circuit device. The method includes the steps of (1) providing a leadframe having a die pad, leads, at least one ring circumscribing the die pad and disposed between the die pad and the leads, a plurality of tie bars projecting outwardly from the at least one ring, and at least one connecting bar electrically interconnecting and mechanically supporting the die pad to the ring; (2) affixing the at least one integrated circuit device to a first side of the die pad and electrically interconnecting the at least one integrated circuit device to the leads and to the at least one ring; (3) encapsulating the at least one integrated circuit device, the first side of the die pad and a first side of the ring in a molding resin while retaining an opposing second side of the ring external to said molding resin; and (4) severing the at least one connecting bar to electrically isolate the die pad from the ring.

In accordance with a second embodiment of the invention, there is provided a package encasing at least one integrated circuit device. The package includes a die pad, a plurality of leads, and at least a first ring circumscribing the die pad and disposed between the die pad and the plurality of leads, each of the die pad, plurality of leads and first ring having first sides and opposing second sides. The at least one integrated circuit device is bonded to the first side of the die pad and electrically interconnected to the first sides of the at least one ring and plurality of leads. The molding resin encapsulates the at least one integrated circuit device and the first sides of the die pad, at least one ring and plurality of leads while the opposing second sides of the die pad, at least one ring and plurality of leads are not encapsulated in the molding resin.

BRIEF DESCRIPTION OF THE DRAWINGS

FIG. 1 shows a lead frame matrix of the invention in bottom planar view.

FIG. 2 is an enlarged view of a portion of the lead frame matrix of FIG. 1.

FIGS. 3A-3C show the enlarged view of FIG. 2 in cross-sectional representation along with differing leadframe configurations achieved with alternative etching procedures.

FIGS. 4A-4C show subsequent encapsulation and isolation of the leadframe configuration of FIG. 3A.

FIGS. 5A-5C show subsequent encapsulation and isolation of the leadframe configuration of FIG. 3B.

FIGS. 6A-6C show subsequent encapsulation and isolation of the leadframe configuration of FIG. 3C.

FIG. 7 shows a QFN package of the invention in bottom isometric view.

FIG. 8 shows the QFN package of the invention in top isometric view.

FIG. 9 shows the QFN package of the invention in cross-sectional representation.

Like reference numbers and designations in the various drawings indicated like elements.

DETAILED DESCRIPTION

FIG. 1 illustrates in bottom planar view a portion of a leadframe matrix 10 forming an array of leadframes 12 in accordance with the invention. The leadframes 12 are formed from an electrically conductive material, such as copper or a copper alloy, and have a die paddle 14, an inner ring 16, an outer ring 18, and a plurality of leads 20. One of the inner 16 and outer 18 rings may be a power bus, providing a common voltage to all I/O pads of an integrated circuit device electrically interconnected to that ring and the other ring may be a ground, providing a common ground to all I/O pads electrically interconnected to that ring. It is not necessary for both a power bus and ground ring to be present, one or the other may be present. Further, there may be more than one of either or both the power ring and ground ring.

Tie bars 22 support the outer ring 18 and mechanically and electrically interconnect adjacent leadframes 12 of the leadframe matrix 10. Connecting bars 24 electrically and mechanically interconnect the outer ring 18 to inner ring 16 and inner ring 16 to die paddle 14. FIG. 2 shows an enlarged view of a portion of a leadframe of the leadframe matrix. Die paddle 14 is electrically interconnected to and supported by inner ring 16 by connecting bar 24. Inner ring 16 is electrically interconnected to and supported by outer ring 18 by connecting bar 24'. Connecting bars 24 and connecting bars 24' are in either a staggered arrangement or aligned.

As shown in cross-sectional representation in FIGS. 3A-3C, the leadframe 12 is preferably formed by a half-etch process. A first side 26 is partially coated with an etch resist material and then immersed in a chemical etch solution to form first etch channels 28 to a depth, D, part way through the metallic sheet being formed into the leadframe. Where complete electrical and mechanical isolation is desired, a second side 30 is partially coated with an etch resistant material and a second chemical etch forms second etch channels, shown in phantom at 32, that come together with the first chemical etch channels 28 forming a through hole.

FIG. 3A illustrates an etching environment where first side 26 is the bottom of the leadframe 12 and both first etch channels 28 are formed by chemical etching from this side. Referring to FIG. 4A, integrated device 34 is then attached to die paddle 14 and electrically interconnected to one or more of first ring 16, second ring 18 and leads 20. The assembly is then encapsulated with first molding resin 35. Following encapsulation, second etch channels 32 are formed by either chemical etching or a mechanical process such as sawing or laser ablation as shown in FIG. 4B. The second etch channels 32 are then, optionally, filled with a second molding compound 37 or other dielectric as shown in FIG. 4C. The second molding compound enhances environmental protection and cosmetic issues and is therefore preferred, but optional. Following this second encapsulation, rings 16, 18 are exposed at a surface 39 of the package.

FIG. 3B illustrates an etching environment where first side 26 is the top of the leadframe 12 and both first etch channels 28 are formed by etching from this side. Referring to FIG. 5A, integrated device 34 is then attached to die paddle 14 and electrically interconnected to one or more of first ring 16, second ring 18 and leads 20. The assembly is then encapsulated with first molding resin 35. Following encapsulation, second etch channels 32 are formed by either chemical etching or a mechanical process such as sawing or laser ablation as shown in FIG. 5B. Second etch channels 32 are then optionally filled with a second molding compound 37 or other dielectric as shown in FIG. 5C. Following this second encapsulation, rings 16, 18 are exposed at a surface 39 of the package.

FIG. 3C illustrates an etching environment where first side 26 is either side of the leadframe 12 and first etch channels 28 are formed by etching from this side. Second etch channels 32 are formed by etching from the opposing second side 30. Referring to FIG. 6A, integrated device 34 is then attached to die paddle 14 and electrically interconnected to one or more of first ring 16, second ring 18 and leads 20. The assembly is then encapsulated with first molding resin 35. Following encapsulation, third etch channels 41 are formed by either chemical etching or a mechanical process such as sawing or laser ablation as shown in FIG. 6B. Third etch channels 41 are then optionally filled with a second molding compound 37 or other dielectric as shown in FIG. 6C. Following this second encapsulation, rings 16, 18 are embedded within the package and not exposed at a surface 39 of the package.

As shown in FIGS. 8 and 9, one or more integrated circuit devices 34 are attached to the die paddle 14 through the use of an electrically conductive epoxy die attach or suitable solder. A single integrated circuit device 34 may be attached to the die paddle 14 as shown, or multiple integrated circuit devices or a combination of integrated circuit devices and passives, such as resistors, may be attached in a single or multi-pass die attach process. The integrated circuit devices are then electrically interconnected 36 to leads 20, electrically interconnected 38 to inner ring 16, electrically interconnected 40 to outer ring 18, and electrically interconnected to passives (not shown), as required.

The leadframe matrix is then placed in a suitable mold and a molding resin introduced that encapsulates the integrated circuit device and first side of the leadframes. Typically, the second sides of the die paddle, rings and leads form a common surface with a sidewall of the package. If the leadframe had not been preplated, the exposed second surfaces are now plated with a different metal to impart corrosion resistance and enhanced solderability. The connecting bars are then severed to electrically isolate the die paddle, inner and outer rings. Severing of the connecting bars may be by any suitable process including chemical etching, drilling, partial sawing and laser ablation.

If a flat package bottom is desired, additional molding resin, or another dielectric, may be utilized to seal the cut areas. Alternatively, a masking material, such as a lacquer, may coat the exposed surfaces to provide corrosion resistance.

The leadframe matrix is then singulated to form separate packages 44 as shown in FIGS. 7 and 9. The package 44 has a die paddle 14 circumscribed by one or more rings 16, 18. A first side 26 of the rings is substantially planar with a first side 26' of the die paddle and available for electrical interconnection such as through wire bonding or tape automated bonding (TAB) metallic strips. A second side 30 of the rings is substantially coplanar with a surface 46 of the package 44 and available for soldering or other electrical interconnection to external circuitry, In this embodiment, the inner 16 and outer 18 rings are solid metal extending from the interior of the package 44 to a surface resulting in a package having improved thermal and electrical properties when compared to a substrate based semiconductor package.

One or more embodiments of the present invention have been described. Nevertheless, it will be understood that various modifications may be made without departing from the spirit and scope of the invention. For example, DFN packages and certain packages with external leads may benefit from being formed with the ground and power rings described herein. Accordingly, other embodiments are within the scope of the following claims.

What is claimed is:

1. A method to manufacture a leadframe suitable for use in a package to encapsulate one or more integrated circuit devices comprising the steps of:
    providing a metallic sheet having a first side and an opposing second side;
    first partially chemically etching the metallic sheet from the first side thereof to form leadframe features including
        a die pad,
        leads,
        at least one ring circumscribing said die pad and disposed between said die pad and said leads, and
        a plurality of tie bars electrically interconnecting said die pad and said at least one ring and projecting outwardly from said at least one ring,
        said die pad, said leads, said at least one ring, and said tie bars having at least one coplanar side;
    subsequently severing each tie bar at a location where the tie bar interconnects said die pad and said ring by removing a portion of the leadframe, thereby electrically isolating said die pad from said ring and forming a cut portion; and
    disposing a non-conductive material in the cut portion.

2. The method of claim 1 including forming a first ring circumscribing said die pad and a second ring circumscribing said first ring wherein said plurality of tie bars project outwardly from said second ring and a first array of connecting bars electrically interconnect and mechanically support said die pad to said first ring and a second array of connecting bars electrically interconnect and mechanically support said first ring to said second ring.

3. The method of claim 2 wherein the connecting bars of said first array and the connecting bars of said second array are formed in an arrangement selected from the group consisting of staggered, aligned and combinations thereof.

4. The method of claim 2 including the additional step, prior to said severing step, of second partially chemically etching said metallic sheet from an opposing second side thereof to a depth less than that required to electrically isolate said leads while retaining at least one connecting bar electrically interconnecting and mechanically supporting said die pad and said at least one ring by at least one of said plurality of tie bars.

5. A method to manufacture a package to encase at least one integrated circuit device comprising the steps of:
    providing a leadframe having a die pad, leads, at least one ring circumscribing said die pad and disposed between said die pad and said leads, a plurality of tie bars projecting outwardly from said at least one ring and at least one connecting bar electrically interconnecting and mechanically supporting said die pad to said ring, said die pad, said leads, said at least one ring and said tie bars having coplanar first sides;
    affixing said at least one integrated circuit device to the first side of said die pad and electrically interconnecting said at least one integrated circuit device to said leads and to said at least one ring;
    encapsulating said at least one integrated circuit device, said first side of said die pad and the first side of said ring in a molding resin while retaining an opposing second side of said ring external to said molding resin and coplanar with an adjacent surface of said molding resin; and
    severing said at least one connecting bar at a location where the connecting bar interconnects said die pad and said ring by removing a portion of the leadframe, thereby electrically isolating said die pad from said ring and forming a cut portion; and
    disposing a non-conductive material in the cut portion.

6. The method of claim 5 wherein an opposing second side of said die pad is retained external to said molding resin, and further including the step of plating said opposing second side of said die pad and said opposing second side of said ring prior to said step of severing.

7. The method of claim 5 including forming a first ring circumscribing said die pad and a second ring circumscribing said first ring wherein said plurality of tie bars project outwardly from said second ring and a first array of connecting bars electrically interconnect and mechanically support said die pad to said first ring and a second array of connecting bars electrically interconnect and mechanically support said first ring to said second ring.

8. The method of claim 7 wherein an opposing second side of said die pad is retained external to said molding resin, and further including the step of plating said opposing second side of said die pad and said opposing second sides of said first ring and said second ring prior to said step of severing.

9. The method of claim 5 wherein the step of disposing comprises disposing molding resin in the cut portion.

10. The method of claim 5 wherein the step of disposing comprises disposing a lacquer in the cut portion.

11. The method of claim 5 wherein in said providing step, a plurality of leadframes are provided in a matrix, and further comprising the step of singulating said matrix subsequent to said step of encapsulating but prior to said step of severing.

12. The method of claim 5 wherein in said providing step, a plurality of leadframes are provided in a matrix, and further comprising the step of singulating said matrix subsequent to said step of severing.

13. A package encasing at least one integrated circuit device comprising:
    a leadframe including a die pad, a plurality of leads, and at least a first ring circumscribing said die pad and disposed between said die pad and said plurality of leads, each of said die pad, plurality of leads and at least a first ring having coplanar first sides and opposing second sides;
    said at least one integrated circuit device bonded to said first side of said die pad and electrically interconnected to said first sides of said at least one ring and plurality of leads;
    a molding resin encapsulating said at least one integrated circuit device and said first sides of said die pad, said at least one ring and said plurality of leads while said opposing second sides of said die pad, said at least one ring and said plurality of leads are not encapsulated in said molding resin and are coplanar with an adjacent surface of said molding resin, so that said second sides and said adjacent surface form a second side of the package; and a non-conductive material filling a cut portion of the leadframe, the cut portion extending into said package from said second side, said non-conductive material having a surface coplanar with said second side.

14. The package of claim 13 wherein said opposing second sides form a common surface with a sidewall of said package.

15. The package of claim 14 wherein said opposing second sides are coated with a different metal.

16. The package of claim 13 wherein a second ring is disposed between said first ring and said plurality of leads.

17. The package of claim 16 wherein said opposing second sides form a common surface with a sidewall of said package.

18. The package of claim 17 wherein said opposing second sides are coated with a different metal.

19. The package of claim 17 wherein at least one of said first ring and said second ring has a desired voltage potential.

20. The package of claim 17 wherein at least one of said first ring and said second ring is electrically grounded.

* * * * *